(12) United States Patent
Joshi et al.

(10) Patent No.: US 9,343,425 B1
(45) Date of Patent: May 17, 2016

(54) METHODS FOR BONDING SUBSTRATES WITH TRANSIENT LIQUID PHASE BONDS BY SPARK PLASMA SINTERING

(71) Applicant: Toyota Motor Engineering & Manufacturing North America, Inc., Erlanger (KY)

(72) Inventors: Shailesh N. Joshi, Ann Arbor, MI (US); Masao Noguchi, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 0 days.

(21) Appl. No.: 14/847,667

(22) Filed: Sep. 8, 2015

(51) Int. Cl.
*H01L 21/46* (2006.01)
*H01L 23/00* (2006.01)
(Continued)

(52) U.S. Cl.
CPC . *H01L 24/83* (2013.01); *C22C 9/00* (2013.01); *C22C 13/00* (2013.01); *C22C 19/03* (2013.01); *C22C 21/00* (2013.01); *C22C 29/02* (2013.01); *C22C 29/12* (2013.01); *C22C 29/16* (2013.01); *H01L 21/4871* (2013.01); *H01L 24/29* (2013.01); *H01L 24/32* (2013.01); *H01L 2224/29111* (2013.01); *H01L 2224/32245* (2013.01); *H01L 2224/8309* (2013.01); *H01L 2224/83026* (2013.01); *H01L 2224/8384* (2013.01); *H01L 2224/83203* (2013.01);
(Continued)

(58) Field of Classification Search
CPC ......... H01L 24/80; H01L 24/83; H01L 24/27; H01L 24/29; H01L 24/30; H01L 24/32; H01L 24/33; H01L 21/187; H01L 21/2007

USPC ................... 438/122, 455, 458, 464
See application file for complete search history.

(56) References Cited

U.S. PATENT DOCUMENTS

| 7,659,614 B2 | 2/2010 | Mehrotra | |
|---|---|---|---|
| 2002/0051848 A1* | 5/2002 | Li | B22F 1/025 427/376.6 |

(Continued)

FOREIGN PATENT DOCUMENTS

| EP | 1498909 | 10/2009 |
|---|---|---|
| WO | WO2012171663 | 12/2012 |

OTHER PUBLICATIONS

Williams, Joel C, "Low temperature transient liquid phase bonding of copper" http://dspace.mit.edu/bitstream/handle/1721.1/33394/62628313-MIT.pdf?sequence=2 Publication date: Jul. 22, 2005.

(Continued)

*Primary Examiner* — Kevin M Picardat
(74) *Attorney, Agent, or Firm* — Dinsmore & Shohl LLP (57) ABSTRACT

According to one embodiment disclosed herein, a first substrate may be bonded to a second substrate by a method which includes providing the first substrate which includes a bonding surface, providing the second substrate which includes a complementary bonding surface, providing a bonding layer precursor which includes metal particles of a first metal composition and metal particles of a second metal composition, and forming a transient liquid phase bonding layer by spark plasma sintering the bonding layer precursor. The bonding layer precursor may be positioned between the first substrate and the second substrate, and the bonding layer may be in contact with the bonding surface of the first substrate and the complementary bonding surface of the second substrate.

20 Claims, 3 Drawing Sheets

(51) Int. Cl.

| | | |
|---|---|---|
| *H01L 21/48* | (2006.01) | |
| *C22C 13/00* | (2006.01) | |
| *C22C 21/00* | (2006.01) | |
| *C22C 9/00* | (2006.01) | |
| *C22C 19/03* | (2006.01) | |
| *C22C 29/12* | (2006.01) | |
| *C22C 29/16* | (2006.01) | |
| *C22C 29/02* | (2006.01) | |

(52) U.S. Cl.
CPC ............... *H01L2924/01013* (2013.01); *H01L 2924/01028* (2013.01); *H01L 2924/01029* (2013.01); *H01L 2924/3656* (2013.01)

(56) References Cited

U.S. PATENT DOCUMENTS

| | | |
|---|---|---|
| 2007/0029369 A1 | 2/2007 | Watkins et al. |
| 2013/0037603 A1 | 2/2013 | Choi et al. |
| 2014/0177132 A1 | 6/2014 | McConnell et al. |
| 2014/0193658 A1 | 7/2014 | Ross et al. |
| 2015/0290771 A1* | 10/2015 | Li ........................... B24D 3/06 51/295 |

OTHER PUBLICATIONS

Saheb, Nouari, et al., "Spark Plasma Sintering of Metals and Metal Matrix Nanocomposites: A Review", Hindawi Publishing corporation, Journal of Nanomaterials, vol. 2012, Article ID 983470, 13 pages, Mar. 23, 2012.

Cook, Grant O III, et al., "Overview of transient liquid phase and partial transient liquid phase bonding", J. Mater Sci (2011); Jan. 19, 2011.

Andersson, Martin, " Ag-In transient liquid phase bonding for high temperature stainless steel micro actuators" http://www.diva-portal.org/smash/get/diva2:648619/FULLTEXT01.pdf; publication date Sep. 2013.

Rhee, Byongho, et al., "Transient Liquid Phase Bonding of Nitrogen Containing Duplex Stainless Steel UNS S31803 Using Ni—Cr—Fe—Si—B Insert Metal"; The Japan Institute of Metals; https://www.jim.or.jp/journal/e/pdf3/44/05/1014.pdf; publication date Mar. 25, 2003.

Bird, R. Keith, et al., "Evaluation of the Transient Liquid Phase (TLP) Bonding Process for Ti3A1-Based Honeycomb Core Sandwich Structure", National Aeronautics and Space Administration; URL: http://ntrs.nasa.gov/archive/nasa/casi.ntrs.nasa.gov/19980201176.pdf; publication date: Jun. 1998.

* cited by examiner

METHODS FOR BONDING SUBSTRATES WITH TRANSIENT LIQUID PHASE BONDS BY SPARK PLASMA SINTERING

TECHNICAL FIELD

The present specification generally relates to the bonding of substrates and, more specifically, to the bonding of substrates with thermally conductive bonding layers.

BACKGROUND

Components of electrical devices which operate at elevated temperatures may need to be bonded with one another. For example, power semiconductor devices, such as those fabricated from silicon carbide, may be designed to operate at very high operating temperatures (e.g., greater than 250° C.). Such power semiconductor devices may be bonded to a cooling device, such as heat sink or a liquid cooling assembly. The cooling device removes heat from the power semiconductor to ensure that it operates at a temperature that is below its maximum operating temperature. The bonding layer that bonds the power semiconductor device to the cooling device must be able to withstand the high operating temperatures of the power semiconductor device. However, conventional bonding techniques, such as solder bonding, may be difficult and/or costly, and may not have sufficient bond strength over thermal cycling. For example, conventional bonding techniques may not be suitable for the thermal cycling of a power semiconductor device.

Accordingly, a need exists for alternative methods for bonding two substrates with one another.

SUMMARY

In one embodiment, a first substrate may be bonded to a second substrate by a method comprising providing the first substrate which comprises a bonding surface, providing the second substrate which comprises a complementary bonding surface, providing a bonding layer precursor comprising metal particles of a first metal composition and metal particles of a second metal composition, and forming a transient liquid phase bonding layer by spark plasma sintering the bonding layer precursor. The bonding layer precursor may be positioned between the first substrate and the second substrate, and the bonding layer may be in contact with the bonding surface of the first substrate and the complementary bonding surface of the second substrate.

In another embodiment, a first substrate may be bonded to a second substrate by a method comprising providing the first substrate which comprises a bonding surface, providing the second substrate which comprises a complementary bonding surface, providing a bonding layer precursor comprising metal particles of a first metal composition and metal particles of a second metal composition, and forming a transient liquid phase bonding layer by spark plasma sintering the bonding layer precursor. The bonding layer precursor may be positioned between the first substrate and the second substrate, and the bonding layer may be in contact with the bonding surface of the first substrate and the complementary bonding surface of the second substrate. The spark plasma sintering may comprise applying a pulsed direct current to the bonding layer precursor to heat the bonding layer precursor, and applying pressure to the bonding layer precursor. The spark plasma sintering may take place in a vacuum environment.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Referring generally to the figures, embodiments of the present disclosure are directed to methods for bonding two or more substrates together with a thermally conductive bonding layer, and additionally, to the resulting bonded substrate systems. The thermally conductive bonding layers disclosed herein may also have relatively high melting points and may be thermally stable through exposure to heat that is of a higher temperature than that used to form the bonds. Generally, each of the substrates may comprise a substrate bonding surface which contacts a bonding layer that is positioned between and contacting the substrates. According to embodiments, substrates may be bonded with one another by utilizing a bonding layer formed by a transient liquid phase bonding process. The bonding layer may be formed from a bonding layer precursor that may comprise particles of one or more metals. The particles may undergo transient liquid phase bonding to form intermetallic materials comprising the materials of the bonding layer precursor and the one or more substrates. In embodiments, the heating needed to form the transient liquid phase bond may be caused by a spark plasma sintering process. Generally, a spark plasma sintering process induces sintering by running a current through the bonding layer precursor material to heat the bonding layer. Spark plasma sintering may also include an application of pressure on the boning layer or substrates. Various embodiments of bonded substrate systems and methods for bonding substrates are described in detail herein.

Figure 1:
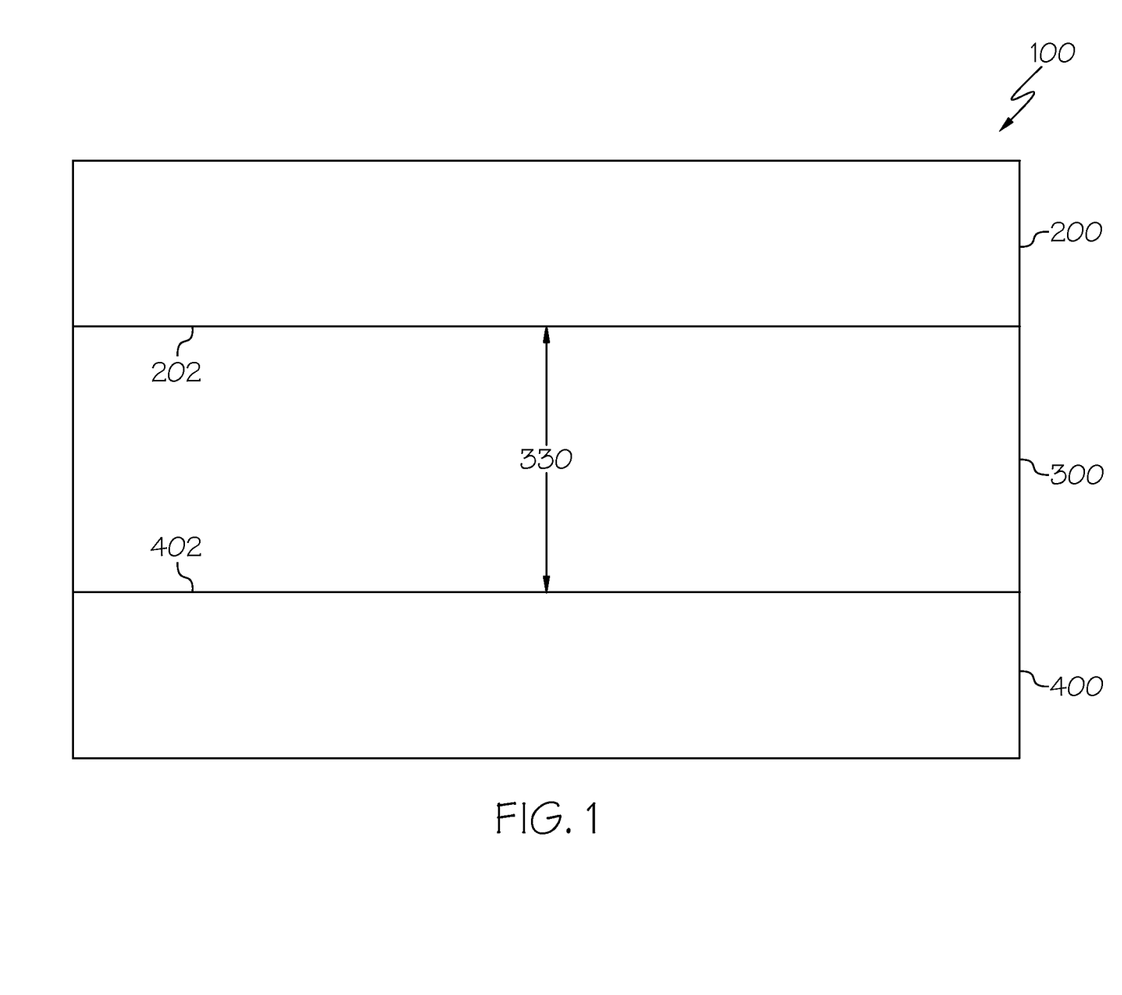
FIG. 1 schematically depicts a cross-sectional side view of two substrates bonded to one another with a bonding layer, according to one or more embodiments shown and described herein.

FIG. 1 generally depicts a system of bonded substrates 100 comprising an upper substrate 200 and a lower substrate 400 bonded to one another with a bonding layer 300. The bonding layer 300 is positioned generally between the upper substrate 200 and the lower substrate 400 and directly contacting the upper substrate 200 at the upper substrate bonding surface 202 and the lower substrate 400 at the complementary lower substrate bonding surface 402. The bonding layer 300 may comprise alloys of metals, pure metals, or each in different portions of the bonding layer 300. As used herein, an "alloy" refers to a material composition that comprises at least two metallic or metalloid components, and a "pure metal" refers to a material that comprises at least about 99.5% of an elemental metal. As used herein "metals" refer to materials comprising metal elements, metalloid elements, or combinations thereof, in an amount of at least about 50%.

In one embodiment, the lower substrate bonding surface 402 and/or the upper substrate bonding surface 202 may be substantially planar and substantially parallel relative to one another. While one substrate is referred to herein as the "upper substrate" and the other substrate is referred to herein as the "lower substrate," the two substrates 200, 400 need not necessarily be arranged above and below one another, and the nomenclature of "upper" and "lower" is merely representative of the relative positioning in the upper substrate 200 and lower substrate 400 as depicted in the drawings described herein. Additionally, it should be understood herein that any feature of the upper substrate 200 may be included in the lower substrate 400, and vice versa. Generally, the lower substrate 400 and the upper substrate 200 each comprise bonding surfaces, referred to as the lower substrate bonding surface 402 and upper substrate bonding surface 202, respectively. The lower substrate bonding surface 402 and upper substrate bonding surface 202 may be referred to as "complementary" herein, meaning that the two bonding surfaces generally have geometries making them suitable for bonding with one another, such as with a bonding layer 300 as described in embodiments herein.

It is contemplated herein that the composition of the lower substrate 400 at the lower substrate bonding surface 402 may be any of the material compositions disclosed herein as a composition of the lower substrate 400. Additionally, it is contemplated herein that the composition of the upper substrate 200 at the upper substrate bonding surface 202 may be any of the material compositions disclosed herein as a composition of the upper substrate 200. In some embodiments, the material composition of the lower substrate 400 and the upper substrate 200 may vary between the portions of each. For example, the material composition at the lower substrate bonding surface 402 may be different from the composition of other portions of the lower substrate 400, and the material composition at the upper substrate bonding surface 202 may be different from the composition of other portions of the upper substrate 200. For example, the upper substrate 200 or the lower substrate 400 may comprise a coating layer at the upper substrate bonding surface 202 or lower substrate bonding surface 402, respectively.

The lower substrate 400 may comprise a wide variety of materials, including, but not limited to, one or more metals or alloys such as, but not limited to, materials comprising copper, aluminum, nickel, or combinations thereof. In embodiments, the lower substrate 400 may comprise at least about 50% copper, at least about 60% copper, at least about 70% copper, at least about 80% copper, at least about 90% copper, at least about 95% copper, at least about 99% copper, at least about 99.5% copper, at least about 50% aluminum, at least about 60% aluminum, at least about 70% aluminum, at least about 80% aluminum, at least about 90% aluminum, at least about 95% aluminum, at least about 99% aluminum, at least about 99.5% aluminum, at least about 50% nickel, at least about 60% nickel, at least about 70% nickel, at least about 80% nickel, at least about 90% nickel, at least about 95% nickel, at least about 99% nickel, and/or at least about 99.5% nickel. For example, the lower substrate 400 may comprise a heat sink for a power electronic device.

In other embodiments, the lower substrate 400 may comprise metal oxides, metal nitrides, metal carbides, or combinations thereof, including, but not limited to, alumina, beryllium oxide, aluminum nitride, silicon carbide, or combinations thereof. For example, the lower substrate 400 may be a die for a power electronic device. In embodiments, the lower substrate 400 may comprise at least about 50% metal oxides, at least about 60% metal oxides, at least about 70% metal oxides, at least about 80% metal oxides, at least about 90% metal oxides, at least about 95% metal oxides, at least about 99% metal oxides, at least about 99.5% metal oxides, at least about 50% metal nitrides, at least about 60% metal nitrides, at least about 70% metal nitrides, at least about 80% metal nitrides, at least about 90% metal nitrides, at least about 95% metal nitrides, at least about 99% metal nitrides, at least about 99.5% metal nitrides, at least about 50% metal carbides, at least about 60% metal carbides, at least about 70% metal carbides, at least about 80% metal carbides, at least about 90% metal carbides, at least about 95% metal carbides, at least about 99% metal carbides, and/or at least about 99.5% metal carbides.

In one embodiment, the lower substrate 400 may comprise a direct bonded metal, such as, but not limited to, direct bonded copper (DBC) or direct bonded aluminum (DBA) at the lower substrate bonding surface 402. For example, direct bonded metallic layer may be bonded to a bulk material by a high-temperature oxidation process where copper and the bulk material are heated to a controlled temperature in an atmosphere of nitrogen containing about 30 ppm of oxygen to form a copper-oxygen eutectic. In another embodiment, the lower substrate 400 may comprise a material that is metal plated on the lower substrate bonding surface 402, such as a nickel plated lower substrate bonding surface 402.

The upper substrate 200 may comprise a wide variety of materials, including, but not limited to, one or more metals or alloys such as, but not limited to, materials comprising copper, aluminum, nickel, or combinations thereof. In embodiments, the upper substrate 200 may comprise at least about 50% copper, at least about 60% copper, at least about 70% copper, at least about 80% copper, at least about 90% copper, at least about 95% copper, at least about 99% copper, at least about 99.5% copper, at least about 50% aluminum, at least about 60% aluminum, at least about 70% aluminum, at least about 80% aluminum, at least about 90% aluminum, at least about 95% aluminum, at least about 99% aluminum, at least about 99.5% aluminum, at least about 50% nickel, at least about 60% nickel, at least about 70% nickel, at least about 80% nickel, at least about 90% nickel, at least about 95% nickel, at least about 99% nickel, and/or at least about 99.5% nickel. For example, the upper substrate 200 may comprise a heat sink for a power electronic device. It is contemplated herein that the composition of the upper substrate 200 at the upper substrate bonding surface 202 may be any of the material compositions disclosed herein.

In other embodiments, the upper substrate 200 may comprise metal oxides, metal nitrides, metal carbides, or combinations thereof, including, but not limited to, alumina, beryllium oxide, aluminum nitride, silicon carbide, or combinations thereof. For example, the upper substrate 200 may comprise a die for a power electronic device. In embodiments, the upper substrate 200 may comprise at least about 50% metal oxides, at least about 60% metal oxides, at least about 70% metal oxides, at least about 80% metal oxides, at least about 90% metal oxides, at least about 95% metal oxides, at least about 99% metal oxides, at least about 99.5% metal oxides, at least about 50% metal nitrides, at least about 60% metal nitrides, at least about 70% metal nitrides, at least about 80% metal nitrides, at least about 90% metal nitrides, at least about 95% metal nitrides, at least about 99% metal nitrides, at least about 99.5% metal nitrides, at least about 50% metal carbides, at least about 60% metal carbides, at least about 70% metal carbides, at least about 80% metal carbides, at least about 90% metal carbides, at least about 95% metal carbides, at least about 99% metal carbides, and/or at least about 99.5% metal carbides. It is contemplated herein that the composition of the upper substrate 200 at the upper substrate bonding surface 202 may be any of the material compositions disclosed herein.

In one embodiment, the upper substrate 200 may comprise a direct bonded metal, such as, but not limited to, direct bonded copper (DBC) or direct bonded aluminum (DBA) at the upper substrate bonding surface 202. For example, direct bonded metallic layer may be bonded to a bulk material by a high-temperature oxidation process where copper and the bulk material are heated to a controlled temperature in an atmosphere of nitrogen containing about 30 ppm of oxygen to form a copper-oxygen eutectic. In another embodiment, the upper substrate 200 may comprise a material that is metal plated on the upper substrate bonding surface 202, such as a nickel plated upper substrate bonding surface 202.

The bonding layer 300 may comprise a transient liquid phase bonded material. In embodiments, the transient liquid phase bonded material may undergo transient liquid phase bonding by a spark plasma sintering process. Generally, transient liquid phase bonding is characterized by a bond between two or more materials that may be stable to heating conditions above those in which the bond is formed. To form a transient liquid phase bond, a low melting point material and a high melting point material are utilized to form an intermetallic alloy comprising the materials of the high melting point material and the low melting point material. The high melting point material and the low melting point material may be referred to as precursor materials, and following the transient liquid phase bonding process (e.g., by spark plasma sintering) the precursor materials are at least partially converted to an intermetallic alloy. As used herein, a low melting point material refers to a material in a transient liquid phase bonding process which has a lower melting point than the high melting point material. The transient liquid phase bonding process may utilize a heating temperature that is between the melting points of the low melting point material and the high melting point material.

Figure 2:
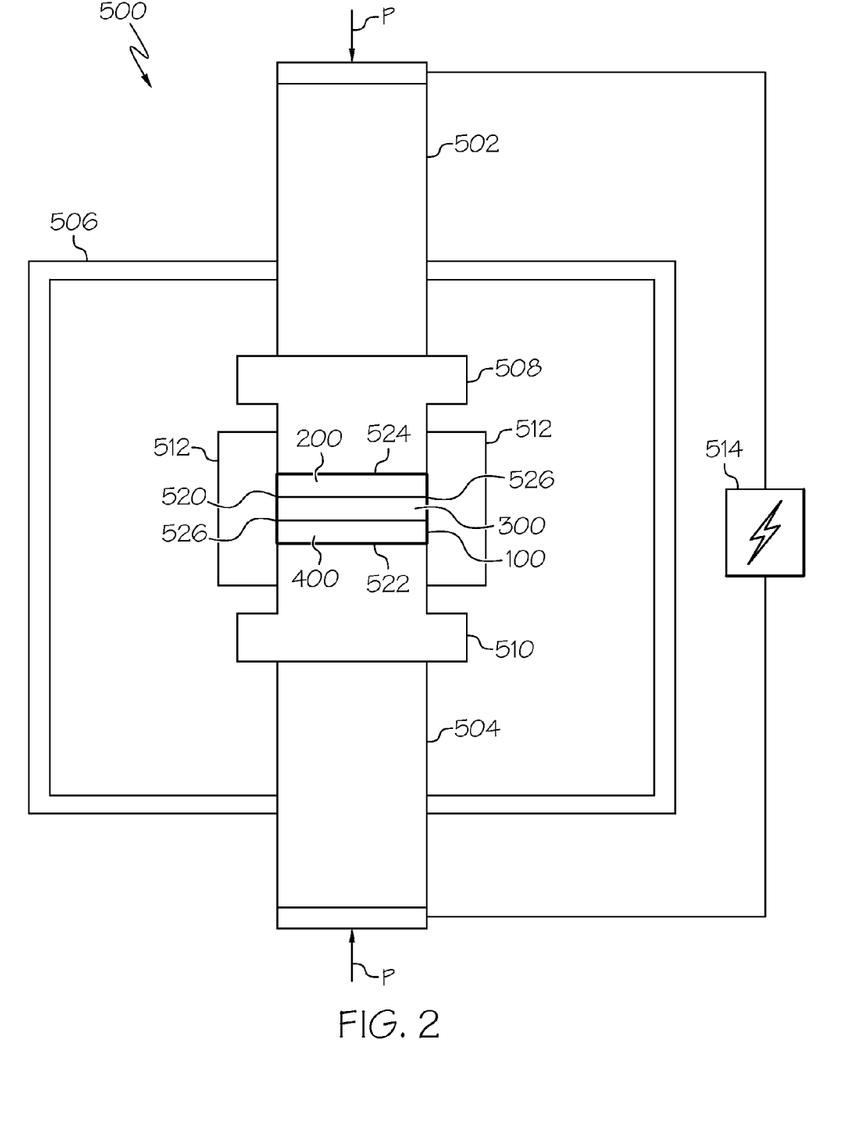
FIG. 2 schematically depicts an example spark plasma sintering processing apparatus, according to one or more embodiments shown and described herein.

The transient liquid phase bonded systems described herein may be fabricated by utilizing a spark plasma sintering process. FIG. 2 schematically depicts an example of a spark plasma sintering processing apparatus 500. The spark plasma sintering processing apparatus 500 may comprise an upper electrode 502, a lower electrode 504, a vacuum chamber 506, a DC pulse generator 514, and a chamber die 512. The upper electrode 502 may comprise an upper punch 508, and the lower electrode 504 may comprise a lower punch 510. The chamber die 512 and the upper and lower punches 508, 510 may define a sintering chamber 520, where the lower punch 510 defines a floor 522 of the sintering chamber 520, the chamber die defines the sides 526 of the sintering chamber 520, and the upper punch 503 defines the ceiling 524 of the sintering chamber 520. Generally, the sample to be sintered is placed in the sintering chamber 520 during processing. FIG. 2 depicts a system of bonded substrates 100 in the sintering chamber 520, where the lower substrate 400 is adjacent the lower punch 510, the upper substrate 200 is adjacent the upper punch 508, and the bonding layer 300 is positioned between the lower substrate 400 and the upper substrate 200. During spark plasma sintering processing, pressure (labeled with arrows marked "P" in FIG. 2) is applied by the lower electrode 504 and the upper electrode 502 such that the materials housed in the sintering chamber 520 come under lateral pressure by the upper and lower punches 508, 510. Additionally, during the spark plasma sintering processing, a DC pulse is applied to the material housed in the sintering chamber 520 by the DC pulse generator 514. The DC pulse generator 514 sends an electrical pulse through the upper electrode 502, through the chamber die 512, and into the lower electrode 504. The resistance of the materials housed in the sintering chamber 520 heat the sintering chamber 520 when electrical pulsing is applied by the DC pulse generator 514. The sintering temperatures may be controlled by variations is several parameters of the DC pulse including, but not limited to, electrical pulse holding time, pulsing ramp rate, pulse duration, and pulse current and voltage. Without being bound by theory, the DC pulse discharge may generate spark plasma, spark impact pressure, Joule heating, and/or an electrical field diffusion effect.

In embodiments, the spark plasma sintering processing may comprise a chamber evacuation step, application of pressure, application of an electrical current, and cooling. In the chamber evacuation step, the vacuum chamber 506 may be evacuated of air to form a vacuum condition. As used herein, a vacuum condition does not refer to a theoretic vacuum (P=0), but rather a low pressure common in laboratory vacuum conditions such as less than about 5%, less than about 1%, or even less than about 0.1% of atmospheric pressure. In the application of pressure step, the upper punch 508 and lower punch 510 apply pressure upon the contents of the sintering chamber 520. Applied pressure may be in a range from about 1 MPa to about 50 MPa, such as, for example, from about 5 MPa to about 40 MPa, or from about 20 MPa to about 30 MPa. The voltage and current of the electrical pulsing may vary, and may depend upon the materials to be sintered. Heating may be to a temperature between the melting points of the high melting point material and the low melting point material in order to form the transient liquid phase bond.

Figure 3:
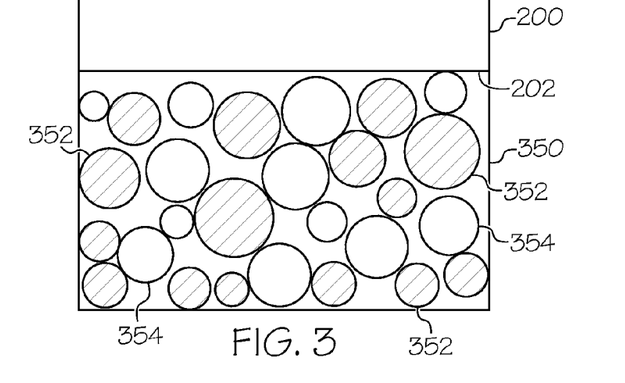
FIG. 3 schematically depicts an enlarged cross-sectional side view of a portion of a bonding layer precursor positioned adjacent to an upper substrate prior to spark plasma sintering, according to one or more embodiments shown and described herein.
Figure 4:
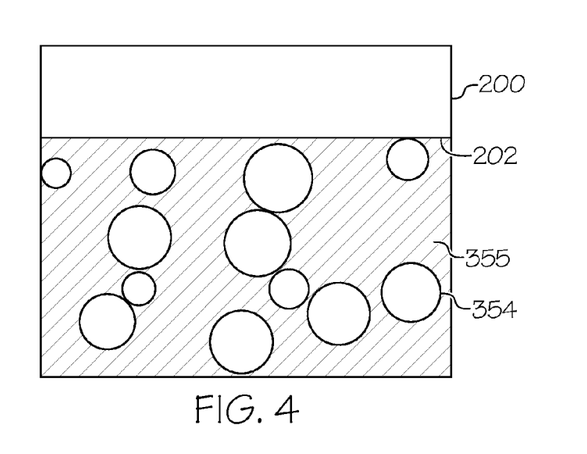
FIG. 4 schematically depicts an enlarged cross-sectional side view of a portion of a bonding layer positioned adjacent to a substrate during a spark plasma sintering process, according to one or more embodiments shown and described herein.

The formation of the transient liquid phase bond of the bonding layer 300 will be described in additional detail with reference to FIGS. 3-5. FIG. 3 schematically depicts an enlarged cross-section side view of a bonding layer precursor 350 adjacent a substrate prior to spark plasma sintering, where the enlarged view depicts only the interface of the upper substrate 200 with the bonding layer precursor 350 (and does not show the lower substrate 400). The bonding layer precursor 350 may comprise a plurality of particles, such as in a powder phase. The particles may have an average particle size of, without limitation, from about 1 micron to about 200 microns, such as from about 2 microns to about 50 microns. The bonding layer precursor 350 may comprise two or more material compositions. For example, FIG. 3 depicts particles having two different material compositions. Particles 352 may comprise a low melting point material and particles 354 may comprise a high melting point material. In some embodiments, the high melting point material may be identical to that of the substrate 200. The bonding layer precursor 350 may be packed by the applied pressure supplied by the spark plasma sintering apparatus.

In embodiments, the low melting point particles 352 may comprise a wide variety of materials, including, but not limited to, one or more metals or alloys such as, but not limited to, materials comprising tin, such as at least about 50% tin, at least about 60%, at least about 70% tin, at least about 80% tin, at least about 90% tin, at least about 95% tin, at least about 99% tin, or even at least about 95.5% tin. In embodiments, the low melting point material may have a melting point of less than about 600° C., less than about 550° C., less than about 500° C., less than about 450° C., less than about 400° C., less than about 350° C., less than about 300° C., or even less than about 250° C. For example, tin has a melting point of about 232° C.

The high melting point particles 354 may comprise a wide variety of materials, including, but not limited to, one or more metals or alloys such as, but not limited to, materials comprising copper, aluminum, nickel, or combinations thereof. In embodiments, the upper substrate 200 may comprise at least about 50% copper, at least about 60% copper, at least about 70% copper, at least about 80% copper, at least about 90% copper, at least about 95% copper, at least about 99% copper, at least about 99.5% copper, at least about 50% aluminum, at least about 60% aluminum, at least about 70% aluminum, at least about 80% aluminum, at least about 90% aluminum, at least about 95% aluminum, at least about 99% aluminum, at least about 99.5% aluminum, at least about 50% nickel, at least about 60% nickel, at least about 70% nickel, at least about 80% nickel, at least about 90% nickel, at least about 95% nickel, at least about 99% nickel, and/or at least about 99.5% nickel.

In other embodiments, the high melting point particles 354 may comprise metal oxides, metal nitrides, metal carbides, or combinations thereof, including, but not limited to, alumina, beryllium oxide, aluminum nitride, silicon carbide, or combinations thereof. In embodiments, the high melting point particles 354 may comprise at least about 50% metal oxides, at least about 60% metal oxides, at least about 70% metal oxides, at least about 80% metal oxides, at least about 90% metal oxides, at least about 95% metal oxides, at least about 99% metal oxides, at least about 99.5% metal oxides, at least about 50% metal nitrides, at least about 60% metal nitrides, at least about 70% metal nitrides, at least about 80% metal nitrides, at least about 90% metal nitrides, at least about 95% metal nitrides, at least about 99% metal nitrides, at least about 99.5% metal nitrides, at least about 50% metal carbides, at least about 60% metal carbides, at least about 70% metal carbides, at least about 80% metal carbides, at least about 90% metal carbides, at least about 95% metal carbides, at least about 99% metal carbides, and/or at least about 99.5% metal carbides.

In embodiments, the high melting point particles 354 may have melting points of at least about 300° C., at least about 400° C., at least about 500° C., at least about 600° C., at least about 800° C., or even at least about 1000° C.

For example, in embodiments the material of the high melting point particles 354 may have a melting point of at least about 50° C. greater, at least about 100° C. greater, at least about 200° C. greater, or even at least about 400° C. greater than the material of the low melting point particles 352.

As described above, a direct electric pulsed current is applied through the bonding layer precursor 350 to heat the low melting point particles 352. FIG. 4 depicts the bonding layer while the transient liquid phase bonding is taking place. As the direct current passes through the bonding layer precursor 350, the low melting point particles 352 melt to form a low melting point material matrix 355. At this stage, the low melting point particles 352 have melted to surround and directly contact the high melting point particles 354. Additionally, at this temperature, some of the material of the low melting point particles 352, now melted as the low melting point material matrix 355, diffuses into the high melting point particles 354. The diffusion of the material of the low melting point material matrix 355 into the high melting point particles creates an intermetallic alloy comprising the materials of the low melting point particles 352 and the high melting point particles 354. However, the alloy formed by diffusion has a higher melting point, and due to the liquidus and solidus concentrations at a given temperature above the melting point of the low melting point material, solid intermetallic is formed even at temperatures above that of the melting point of the low melting point material. The same phenomena of diffusion may also occur at the interface of the substrate 200, where an intermetallic alloy is formed from diffusion of the low melting point material into the substrate 200. The material of low melting point continues to diffuse into the material of high melting point to form intermetallic alloys that at least partially solidify at the heating temperature.

Figure 5:
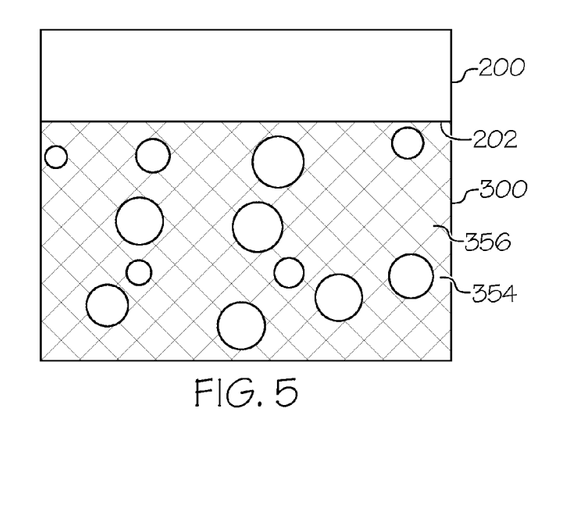
FIG. 5 schematically depicts an enlarged cross-sectional side view of a portion of a bonding layer following a spark plasma sintering process, according to one or more embodiments shown and described herein.

FIG. 5 depicts a bonding layer 300 that has been formed by transient liquid phase bonding. The bonding layer 300 comprises some particles 354 of high melting point material in an intermetallic alloy 356 comprising the materials of the high melting point particles 354 and the low melting point particles 352. High melting point particles 354 are reduced in size because some of its material is present in the intermetallic alloy 356.) Following the heating by the direct current, the current is stopped and cooling takes place to fully solidify the bonding layer 300.

For example, in a system with a tin material for the low melting point particles 352 and copper for the high melting point particles 354 and substrate, the tin may have a melting point of about 232° C. and the copper may have a melting point of about 1085° C. In such an embodiment, the spark plasma sintering process for bonding may be utilize a bonding temperature of greater than about 250° C. but less than about 1000° C. The transient liquid phase bonding may form an alloy comprising tin and copper as the intermetallic alloy 356.

In embodiments, the utilization of spark plasma sintering may form a bonding layer 300 that is sufficiently voidless and does not require the use of flux. In conventional transient liquid phase bonding formation by conventional heating sources (such as radiant heating), flux may be necessary to form bonding layers that do not have voids or have a reduced amount of voids. Generally, flux may be a chemical cleaning agent, flowing agent, or purifying agent such as, but not limited to, ammonium chloride or rosin, hydrochloric acid, zinc chloride, and borax. Fluxes may promote wettablility of substrates in transient liquid phase bonding. However, fluxes must be removed following bond formation, and if not completely removed, can cause corrosion on a bonding layer. Therefore, an advantage of the presently disclosed process of forming a transient liquid phase bonded layer by spark plasma sintering is that flux is not needed, and voids can be reduced or eliminated without the use of flux. In embodiments, the bonding layers described herein may be substantially voidless. For example, the bonding layer 300 may have void areas (i.e., areas comprising gases) of less than about 2%, less than about 1%, less than about 0.5%, or even less than about 0.1% of the total volume of the bonding layer 300.

Referring again to FIG. 1, the resulting bonded substrates 200, 400 may be spaced by a thickness 330 of the bonding layer 300, which is the distance between the upper substrate bonding surface 202 and the lower substrate bonding surface 402. In embodiments, the thickness 330 of the bonding layer 300 may be from about 5 microns to about 5000 microns, from about 50 microns to about 1000 microns, or from about 100 microns to about 500 microns. For example, the thickness 330 of the bonding layer 300 may be at least about 5 microns, at least about 25 microns, at least about 50 microns, at least about 100 microns, at least about 200 microns, at least about 500 microns, less than or equal to about 10000 microns, less than or equal to about 5000 microns, less than or equal to about 1000 microns, less than or equal to about 500 microns, less than or equal to about 250 microns, less than or equal to about 100 microns, or combinations thereof.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

As used throughout this disclosure, percentages of components in a material composition are described by their weight percent. For example, "%" as used herein refers to the weight percent of a component.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method for bonding a first substrate to a second substrate, the method comprising:
    providing the first substrate comprising a bonding surface;
    providing the second substrate comprising a complementary bonding surface;
    providing a bonding layer precursor comprising metal particles of a first metal composition and metal particles of a second metal composition, the bonding layer precursor positioned between the first substrate and the second substrate, and the bonding layer in contact with the bonding surface of the first substrate and the complementary bonding surface of the second substrate; and
    forming a transient liquid phase bonding layer by spark plasma sintering the bonding layer precursor.

2. The method of claim 1, wherein the spark plasma sintering comprises applying a direct current to the bonding layer precursor.

3. The method of claim 2, wherein the application of the direct current heats the bonding layer precursor.

4. The method of claim 2, wherein the direct current is pulsed.

5. The method of claim 1, wherein the spark plasma sintering comprises applying pressure to the bonding layer precursor.

6. The method of claim 1, wherein the spark plasma sintering takes place in a vacuum environment.

7. The method of claim 1, wherein the forming of the bonding layer does not utilize a flux.

8. The method of claim 1, wherein the bonding layer is substantially voidless.

9. The method of claim 1, wherein the first metal composition has a melting point of less than about 400° C.

10. The method of claim 1, wherein the second metal composition has a melting point of greater than about 500° C.

11. The method of claim 1, wherein a melting point of the first metal composition is at least about 100° C. less than a melting point of the second metal composition.

12. The method of claim 1, wherein the first metal composition comprises at least about 95% tin.

13. The method of claim 1, wherein the second metal composition comprises at least about 95% of aluminum, nickel, copper, or combinations thereof.

14. The method of claim 1, wherein the bonding layer comprises an alloy of tin.

15. The method of claim 1, wherein the bonding layer comprises an alloy of tin, and further comprises aluminum, nickel, copper, or combinations thereof.

16. The method of claim 1, wherein the bonding surface of the first substrate comprises a metal chosen from aluminum, nickel, copper, or combinations thereof.

17. The method of claim 1, wherein the complementary bonding surface of the second substrate comprises a metal chosen from aluminum, nickel, copper, or combinations thereof.

18. A method for bonding a first substrate to a second substrate, the method comprising:
    providing the first substrate comprising a bonding surface;
    providing the second substrate comprising a complementary bonding surface;
    providing a bonding layer precursor comprising metal particles of a first metal composition and metal particles of a second metal composition, the bonding layer precursor positioned between the first substrate and the second substrate, and the bonding layer in contact with the bonding surface of the first substrate and the complementary bonding surface of the second substrate; and
    forming a transient liquid phase bonding layer by spark plasma sintering the bonding layer precursor, the spark plasma sintering comprising:
        applying a pulsed direct current to the bonding layer precursor to heat the bonding layer precursor; and
        applying pressure to the bonding layer precursor, wherein the spark plasma sintering takes place in a vacuum environment.

19. The method of claim 18, wherein the forming of the bonding layer does not utilize a flux.

20. The method of claim 18, wherein the bonding layer is substantially voidless.

* * * * *

UNITED STATES PATENT AND TRADEMARK OFFICE
CERTIFICATE OF CORRECTION

PATENT NO. : 9,343,425 B1
APPLICATION NO. : 14/847667
DATED : May 17, 2016
INVENTOR(S) : Shailesh N. Joshi and Masao Noguchi

Page 1 of 1

It is certified that error appears in the above-identified patent and that said Letters Patent is hereby corrected as shown below:

In the specification

In Column 8, Line 51, after "Fluxes may promote", delete "wettablility" and insert --wettability--, therefor.

Signed and Sealed this
Twenty-third Day of August, 2016

Michelle K. Lee
*Director of the United States Patent and Trademark Office*